Figure 1:
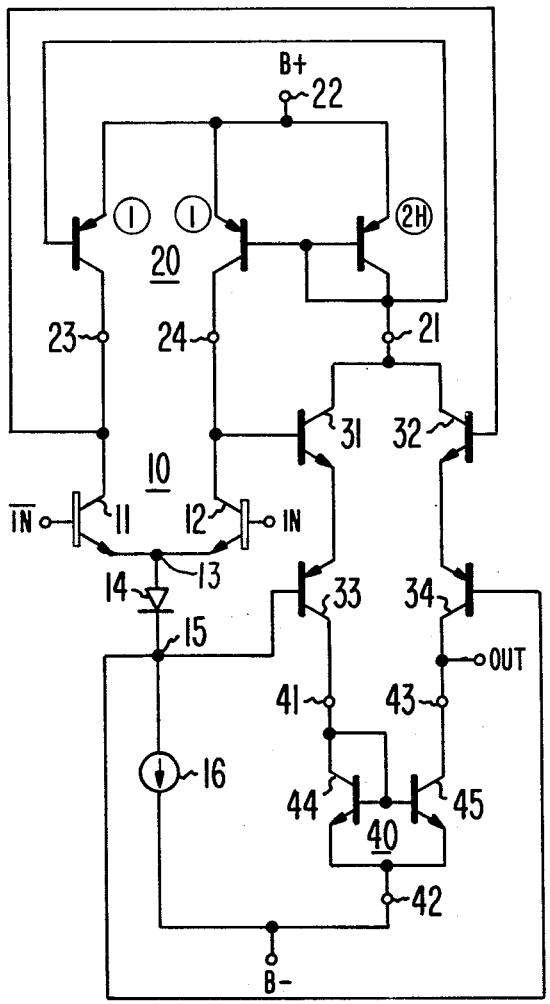

United States Patent [19]

Leidich

[11] 4,007,427
[45] Feb. 8, 1977

[54] CASCADED TRANSISTOR AMPLIFIER STAGES

[75] Inventor: Arthur John Leidich, Flemington, N.J.

[73] Assignee: RCA Corporation, New York, N.Y.

[22] Filed: Apr. 7, 1976

[21] Appl. No.: 674,506

[52] U.S. Cl. .............................. 330/20; 330/30 D
[51] Int. Cl.² .................................. H03F 3/45
[58] Field of Search ............ 330/20, 30 D, 38 M

[56] References Cited
UNITED STATES PATENTS 3,959,733   5/1976   Solomon et al. ............... 330/30 D

*Primary Examiner*—James B. Mullins
*Attorney, Agent, or Firm*—H. Christoffersen; S. Cohen; A. L. R. Limberg

[57] ABSTRACT

Input transistors in long-tailed pair have their emitter-to-collector potentials regulated to a small value by the ensuing amplifier stage, reducing their tendency to have collector-to-base leakage currents and permitting them to be super-beta types.

11 Claims, 5 Drawing Figures

CASCADED TRANSISTOR AMPLIFIER STAGES

The present invention relates to cascaded transistor amplifier stages of a sort useful, for example, as the early stages of an operational amplifier or operational transconductance amplifier.

Conventionally, in such applications, the input amplifier stage is a long-tailed pair configuration comprising: a pair of emitter-coupled transistors having their respective base electrodes connected to separate ones of the inverting and non-inverting input terminals of the complete amplifier. A standard objective in design is to reduce the quiescent currents demanded at these input terminals, whether due to collector-to-base leakage current ($I_{co}$) or to conventional base current, to as low a value as possible, to reduce offset errors arising when the complete amplifier is connected in direct-coupled degenerative feedback loops. Collector-to-base leakage currents can be reduced by the expedient of reducing the difference in potential between the base and collector electrodes of each of the emitter-coupled transistors. Conventional base current can be reduced through the use of transistors with very high common-forward current gain ($h_{fe}$). Transistors with very thin base regions called "super-beta" or "punch-through" transistors provide $h_{fe}$'s of 500 to a few thousand, but must be operated with low emitter-and base-to-collector potentials to avoid transistor breakdown.

It has become common practice therefore to operate the long-tailed pair transistors each in cascode with a respective common-base amplifier transistor direct-coupled after it, with the base electrodes of the common-base amplifier transistor offset a volt or so in potential from an interconnection between the emitter electrodes of the emitter-coupled differential-amplifier transistors. This is done to regulate the quiescent emitter-to-collector potentials of the long-tailed pair transistors to substantially equal their respective quiescent emitter-to-base potentials. The desired offset potential is often provided by a forward-biased series connection of junction diodes or self-biased transistors. Cascode input stages undesirably exhibit greater noise than input stages using simple transistors, however.

In circuits embodying the present invention, the regulation of the emitter-to-collector potentials of the input transistors is carried out concurrently with the biasing of the transistors in the ensuing differential-amplifier stage, without involving the input transistors in cascode connection.

Each of FIGS. 1–5 is a schematic diagram of a cascade of differential amplifier stages, which embody the present invention.

In FIG. 1, long-tailed pair configuration 10 includes emitter-coupled NPN transistors 11 and 12, which are common-emitter amplifiers for differential-mode signals. Transistors 11 and 12 are shown as being of super-beta type (with elongated rectangularly shaped base regions rather than single-line base regions of the other transistors, used to indicate that they are of conventional type). The circuit inverting input terminal IN and non-inverting input terminal $\overline{\text{IN}}$ are connected to the base electrode of transistor 12 and to the base electrode of transistor 11, respectively. The interconnection 13 between the emitter electrodes of 11 and 12 has a constant current withdrawn therefrom via diode 14 and node 15 by a constant current sink 16, which sink is typically provided by the collector electrode of an NPN transistor with a suitably biased base-emitter circuit. Transistors 11 and 12 are provided active collector loads from separate output terminals 23 and 24 of a dual-output current mirror amplifier (CMA) 20. CMA 20 has an input terminal 21, and has a common terminal 22 arranged for connection to B+ positive operating potential.

The collector electrodes of transistors 11 and 12, respectively, are connected to the base electrodes of NPN transistors 32 and 31, respectively, which are common-collector amplifiers insofar as differential-mode signals are concerned. The emitter electrodes of 31 and 32, respectively, are connected to the emitter electrodes of PNP transistors 33 and 34, respectively, which have their base electrodes connected together and to node 15. Node 15 is a virtual ground for differential-mode signals, so transistors 33 and 34 behave as common-base amplifiers for such signals.

Current mirror amplifier 40 has an input terminal 41 to which the collector current of transistor 33 is applied; a common terminal 42 arranged for connection to B− negative operating potential; and an output terminal 43 from which is supplied an output current proportional in amplitude and opposite in direction from the collector current of 33. CMA 40 acts as a balanced-to-single-ended signal converter, constructively combining the differential-mode signal variations in the collector currents of 33 and 34 for application to terminal OUT and rejecting their common-mode quiescent components from being applied to terminal OUT.

The direct-coupled emitter-to-emitter connections of 31 and 33 and of 32 and 34 make it attractive to use collector-to-base feedback around 31 and 32 or 33 and 34 to establish well-defined quiescent current levels in these transistors. In FIG. 1, the collector electrodes of 31 and 32 are interconnected at the input terminal 21 of dual-output CMA 20, completing a degenerative feedback loop for common-mode signal. This loop adjusts the sum of the quiescent currents supplied at output terminals 23 and 24 of CMA 20 to equal the sum of (a) the quiescent collector currents demanded by transistors 11 and 12 responsive to the combined current demand placed on their emitters by sink 16 and (b) the relatively small quiescent base currents of 31 and 32. At the same time, supposing the current gain of CMA 20 from input terminal 21 to each of its output terminals 23 and 24 to have a value of $-G = -\frac{1}{2}H$, the degenerative feedback forces the quiescent collector-to-emitter current levels in transistors 31 and 32 (and, consequently, transistors 33, 34, 44, 45) to be H times as large as those in transistors 11 and 12—i.e., H/2 times the current demand of sink 16.

Beginning at interconnection 13, one may now ascertain the collector potentials of 11 and 12 as referred to the common-mode signal potential $V_{13}$ at interconnection 13. All the semiconductor elements are assumed to be of the same basic material—e.g., silicon—in the following analysis. Node 15 is at a potential $V_{15}$ which is one junction offset potential lower in potential than $V_{13}$ because of the offset across element 14, which may in actuality consist of a self-biased transistor. The emitter potential of 33 and 34 will be essentially one junction offset potential higher in potential than their base electrodes which are at $V_{15}$. So, the emitter potentials of 31, 32, 33 and 34 will all, like those of 11 and 12, be substantially equal to $V_{13}$. The base potentials of transistors 11, 12, 31 and 32 will all be substantially one junction-offset-potential higher than $V_{13}$. The collector potentials of 11 and 12, being respectively equal to the base potential of 32 and the base potential of 31, are therefore substantially equal to the base potentials of 11 and 12, leading to reduced collector-to-base leakage currents ($I_{CO}$'s) and permitting 11 and 12 to be super-beta transistors.

Figure 2:
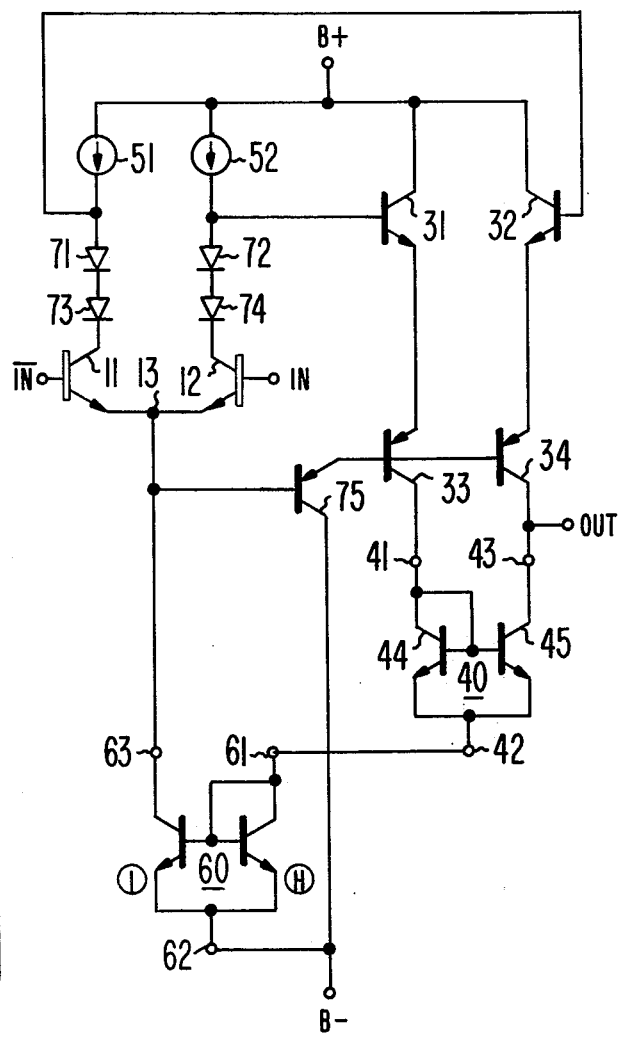

FIG. 2 shows a cascade of amplifier stages differing from that of FIG. 1 primarily in the way in which common-mode feedback is used to proportion the quiescent currents in the input and ensuing amplifier stages. Constant current sources 51 and 52 provide active collector loads to transistors 11 and 12, respectively, supplying them substantially equal quiescent collector currents of predetermined value. The common-mode feedback connection adjusting the ratio of quiescent currents in the input and ensuing amplifier stages is taken from the collectors of 33 and 34, rather than of 31 and 32 as in the FIG. 1 amplifier cascade. The quiescent collector currents of transistors 33 and 34 appear combined together at common terminal 42 of CMA 40, assuming terminal OUT to be connected to subsequent circuitry which does not draw substantial quiescent current, and the combined currents are applied together to the input terminal 61 of a dual-output CMA 60. CMA 60 has a common terminal 62 connected to the B− negative operating potential and exhibits an inverting current gain of −1/H between its input terminal 61 and an output terminal 63 connected to the interconnection 13 between the emitter electrodes of input transistors 11 and 12.

Under quiescent conditions, the terminals IN and $\overline{\text{IN}}$ are at the same potential, a potential somewhere between the B− and B+ operating potentials, so the collector currents of transistors 11 and 12 will be similar. Common-mode feedback adjusts the collector currents demanded by 11 and 12 to be just a bit smaller than the currents supplied by constant current sources 51 and 52, allowing base currents to flow to transistors 31 and 32 just sufficient to support emitter current levels in transistors 31 and 32 H times those in transistors 11 and 12. Were the collector currents demanded by 11 and 12 smaller, there would be an increase in the portions of the currents supplied by constant current sources 51 and 52 applied as base currents to transistors 31 and 32. The resulting increased emitter currents from 31 and 32 would, by the common-base amplifier actions of transistors 33 and 34, cause increased quiescent collector currents from 33 and 34. There would be an increase in the combined quiescent collector currents from 33 and 34 at terminal 42 of CMA 40, which applied to the input terminals 61 of CMA 60 would cause a proportional increase in the current demanded at the output terminal 63 of CMA 60. This increased current demand applied to interconnection 13 between the emitter electrodes of 11 and 12 would by their respective common-base amplifier actions increase their respective quiescent collector current demands to be more closely equal to the respective currents supplied by sources 51 and 52 and thereby would reduce to the desired level the base current flow to 31 and 32. Conversely, excessive quiescent collector current demands by 11 and 12 would reduce the base currents applied to transistors 31 and 32, the emitter currents of 31 and 32 applied to transistors 33 and 34, the collector currents of 33 and 34 resulting from their respective common base amplifier actions, the current applied to input terminal 61 of CMA 60, the current demanded at the output terminal 63 of CMA 60 as combined emitter currents from 11 and 12. The current demand at 61 and 63 would reduce the collector currents of transistors 11 and 12 to the desired lower level and increase correspondingly the base current flow to 31 and 32.

The FIG. 2 amplifier cascade also differs from the FIG. 1 amplifier cascade in that the interconnection 13 between the emitter electrodes of input transistors 11 and 12 is direct coupled to the base electrodes of 33 and 34 by a PNP emitter-follower transistor 75. This places the base electrodes of 33 and 34 one junction offset potential above $V_{13}$, their emitter electrodes and those of 31 and 32 two junction offset potentials above $V_{13}$. Diodes 71–74 introduce offset potentials that place the collector electrodes of 11 and 12 at potentials each about one junction offset potential above $V_{13}$, to reduce the base-to-collector voltages of 11 and 12 nearly to zero.

Figure 3:
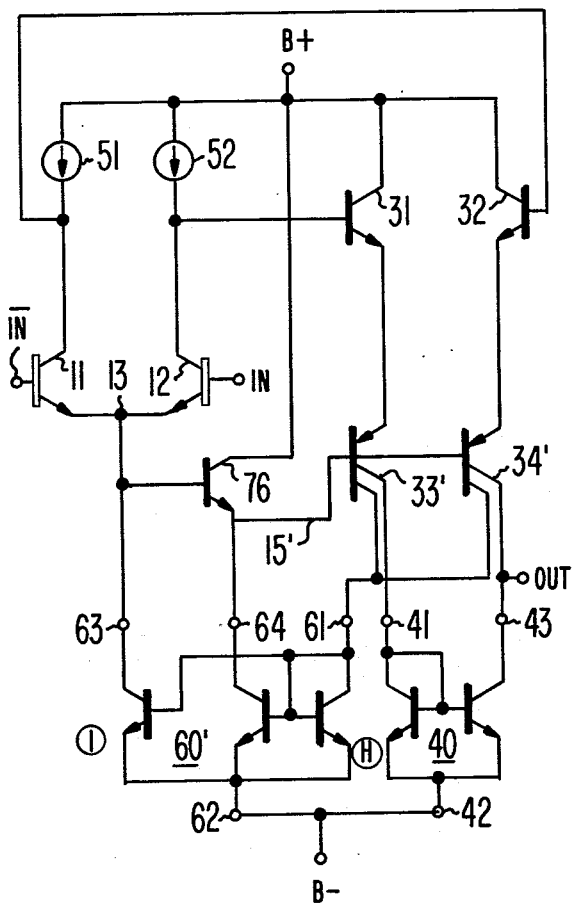

The FIG. 3 amplifier cascade differs from that of FIG. 2 in that transistors 33 and 34 are replaced with dual collector transistors 33' and 34'. One collector of each of transistors 33' and 34' is connected to CMA input terminal 61 to close the common-mode feedback loop used to adjust the relative current levels in the input and ensuing amplifier stages; the other collectors of 33' and 34' are connected to respective ones of the input and output terminals 41 and 42 of CMA 40. This permits CMA 40 to be operated with its common terminal connected directly to B-negative operating potential, necessary when terminal OUT is direct coupled by direct connection to the base electrode of an ensuing transistor (not shown) having emitter electrode connected to B− negative operating potential. PNP emitter-follower transistor 75 is replaced by an NPN emitter-follower transistor 76, which translates potential from node 13 to node 15' similarly to diode 14 of FIG. 1 so diodes 71–74 can be replaced by direct connections. CMA 60 is modified to a dual-output CMA 60' with a second output terminal 64 sinking the base currents of transistors 33' and 34' and maintaining the base-emitter junction of transistor 76 forward-biased.

Figure 4:
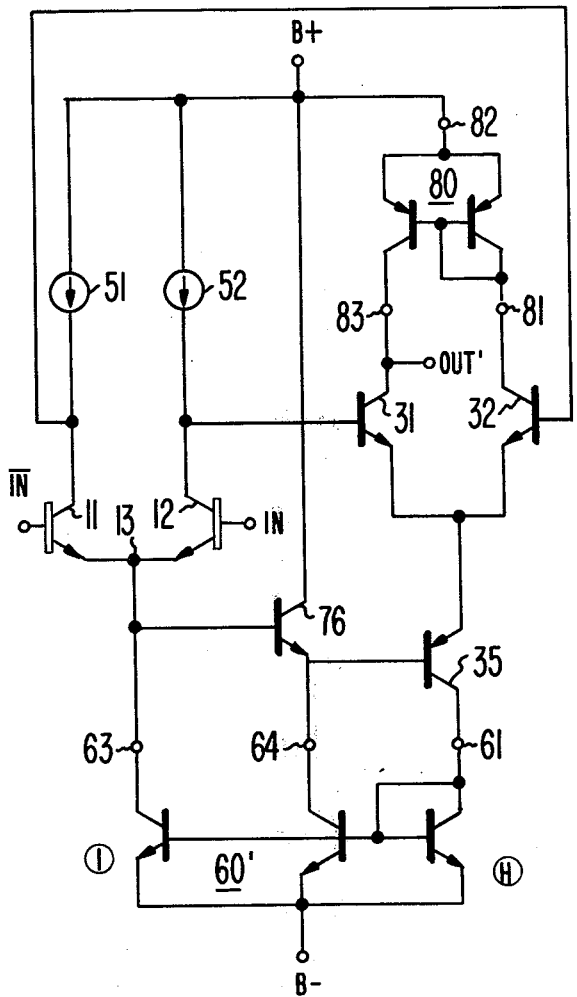

The FIG. 4 amplifier cascade is similar to that of FIG. 3 except that it is the collector currents of transistors 31 and 32 that are differentially combined to appear at a terminal OUT', rather than collector currents of transistors 33' and 34' that are differentially combined to appear at terminal OUT. This eliminates the need for the transistors 33' and 34' each with separate, dual collectors and permits their replacement in the common-mode current feedback loop by a single PNP common-base amplifier transistor 35. CMA 80 has an input terminal 81 connected to the collector of 32, an output terminal 83 connected to OUT' and to the collector of 31, and a common terminal 82 connected to B+ positive operating potential. CMA 80 aids the differential combining of the collector currents of transistors 31 and 32.

Figure 5:
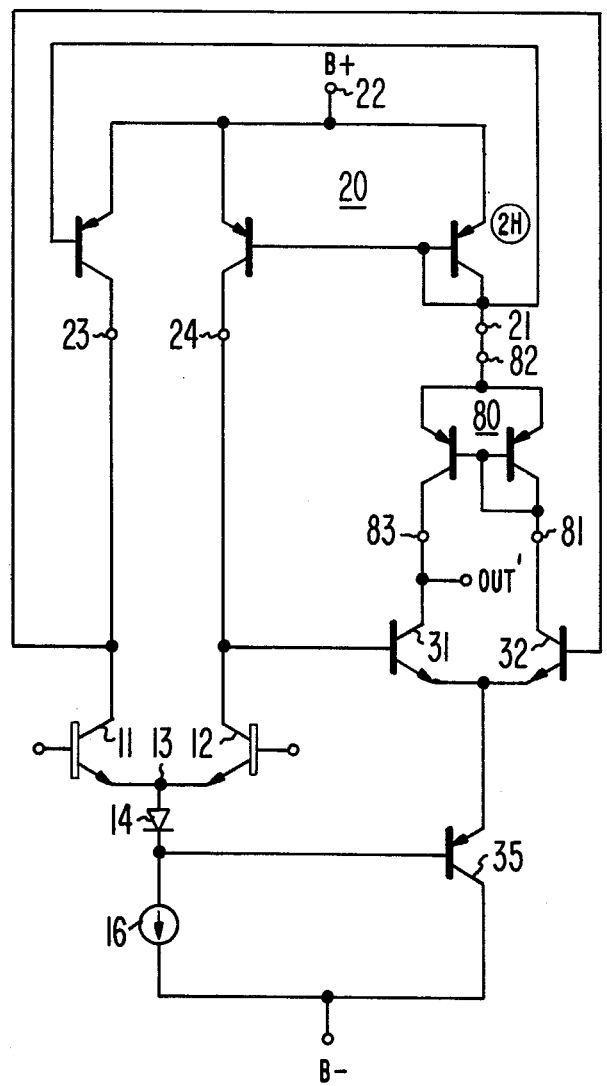

The FIG. 5 amplifier cascade is a modification of the FIG. 1 amplifier cascade in which the collector currents of transistors 31 and 32 are differentially combined to appear at terminal OUT.

A common feature to be found in each of the embodiments of the invention shown in FIGS. 1–5 is the use of a potential follower means (33, 34 in FIG. 1; 75, 33, 34 in FIG. 2; 76, 33', 34' in FIG. 3; 76, 35 in FIG. 4, 35 in FIG. 5) to buffer interconnection 13 from the emitter current demands imposed by transistors 31 and 32. This maintains the common-mode impedance connected to interconnection 13 large so common-mode signal rejection is good. The circuits of FIGS. 1 and 2 may be constructed using processing steps resulting in transistors 11 and 12 being characterized by (a) maximum emitter-to-collector potentials of a few volts and (b) very low $I_{CO}$'s compared to their base currents ($I_B$'s) associated with actual transistor action. In such circumstances, potential shifting elements 14 and 71–74 are superfluous and may be omitted from these circuits. Small current gain degeneration resistors may be inserted in series connection with the base-emitter junctions of transistors 31 and 32, the resistors being connected at the emitter ends of the junctions. CMA 20, 40 or 80 may be replaced with a CMA having cascoded devices in its input and output circuits.

To obtain larger ratio of currents in 31, 32 to those in −1, 12 without need for large mirroring ratios, which tend to take up excessive area during integration, one may replace the self-biased transistors in the input circuits of CMA 40, 60 or 60'. Or CMA 40, 60 or 60' may be replaced by current attenuators as described by Ahmed in U.S. Pat. Nos. 3,846,696 and 3,868,581.

One skilled in the art of electronic circuit design will, in light of the foregoing description and FIGS. 1–5, perceive a range of other possible design variations embodying the present invention; and this should be borne in mind in assessing the scope of the following claims.

What is claimed is:

1. In combination:
   first, second, third and fourth transistors of a first conductivity type, each having base and emitter and collector electrodes;
   first and second input terminals at the base electrodes of said first and said second transistors, respectively;
   means for connecting said first and said second transistors in long-tailed pair configuration including means for maintaining constant-current flow to an interconnection between the emitter electrodes of said first and said second transistors;
   means for regulating the emitter-to-collector potentials of said first and said second transistors including:
   means direct coupling the collector electrode of said first transistor and the base electrode of said third transistor;
   means direct coupling the collector electrode of said second transistor and the base electrode of said fourth transistor; and
   potential follower means for applying potentials to the emitter electrodes of said third and said fourth transistors that follow the potential at the interconnection between the emitter electrodes of said first and said second transistors; and
   means biasing the collector electrodes of said third and said fourth transistors for normal transistor operation.

2. The combination set forth in claim 1 wherein said potential follower means includes:
   fifth and sixth transistors each being of a second conductivity type opposite to said first conductivity type, and each having base and emitter and collector electrodes;
   means galvanically connecting the emitter electrodes of said third and said fifth transistors;
   means galvanically connecting the emitter electrodes of said fourth and said sixth transistors; and
   means direct coupling the interconnection between the emitter electrodes of said first and said second transistors to the base electrodes of said fifth and said sixth transistors.

3. The combination set forth in claim 2 wherein the number of forward-biased semiconductor junctions between the base electrodes of said third and fifth transistors is N, the number of forward-biased semiconductor junctions between the base electrodes of said fourth and sixth transistors is N, there is no substantial dropping resistor included in either said means galvanically connecting the emitter electrodes of said third and said fifth transistors or said means galvanically connecting the emitter electrodes of said fourth and said sixth transistors, and said means direct coupling the interconnection between the emitter electrodes of said first and said second transistors to the base electrodes of said fifth and said sixth transistors comprises a number of forward-biased semiconductor junctions connected between said interconnection and an interconnection between the base electrodes of said fifth and said sixth transistors, whereby each of said first and said second transistors is provided with substantially equal quiescent potentials at its base and collector electrodes.

4. The combination set forth in claim 2 wherein said first and said second transistors are of super-beta type and have concomitantly small maximum emitter-to-collector potential rating, the number of forward-biased semiconductor junctions between the base electrodes of said third and said fifth transistors is N, the number of forward-biased semiconductor junctions between the base electrodes of said fourth and said sixth transistors is N, there is no substantial dropping resistor included in either said means galvanically connecting the emitter electrodes of said third and said fifth transistors or said means galvanically connecting the emitter electrodes of said fourth and said sixth transistors, and said means direct coupling the interconnection between the emitter electrodes of said first and said second transistors to the base electrodes of said fifth and said sixth transistors comprises a number, M, less than N, of forward-biased semiconductor junctions connected between said interconnection and an interconnection between the base electrodes of said fifth and said sixth transistors, whereby each of said first and said second transistors is provided with a quiescent base-to-collector potential substantially equal to (N-M) times the offset potential across a forward-biased semiconductor junction, N and M being so chosen that the quiescent base-to-collector potentials of said first and said second transistors are smaller than their maximum emitter-to-collector potential rating.

5. The combination set forth in claim 2 having:
   an output terminal at the collector electrode of at least one of said fifth and said sixth transistors;
   means biasing the collector electrode of said fifth and said sixth transistors for normal transistor operation;
   a current amplifier having an input terminal to which the collector electrode of said third and said fourth transistors are galvanically connected, having a common terminal for connection to an operating potential, having an input circuit between its input and common terminals included in said means biasing the collector electrodes of said third and said fourth transistors, and having first and second output terminals galvanically connected respectively to the collector electrode of said first transistor and to the collector electrode of said second transistor, thereby completing a common-mode degenerative current-feedback connection between the collector and base electrodes of each said third and said fourth transistors.

6. The combination set forth in claim 5 having:
a current amplifier having an input terminal to which the collector electrode of said third and said fourth transistors are galvanically connected, having a common terminal for connection to an operating potential, having an input circuit between its input and common terminals included in said means biasing the collector electrodes of said third and said fourth transistors, and having first and second output terminals galvanically connected respectively to the collector electrode of said first transistor and to the collector electrode of said second transistor, thereby completing a common-mode degenerative current-feedback connection between the collector and base electrodes of each of said third and said fourth transistors.

7. The combination set forth in claim 5 wherein:
said means for maintaining constant current flow to an interconnection between the emitter electrodes of said first and second transistors includes:
a current amplifier having an input terminal to which the collector electrode of said fifth transistor is galvanically connected, having a common terminal for connection to an operating potential, having an output terminal galvanically connected to the interconnection between the emitter electrodes of said first and said second transistors; and
means for additively combining collector current of said fifth and said sixth transistors and applying the resultant sum current to the input terminal of said current amplifier.

8. The combination set forth in claim 2 wherein said means for maintaining constant-current flow to an interconnection between the emitter electrodes of said first and second transistors includes:
a current amplifier having an input terminal, having a common terminal for connection to an operating potential, having an output terminal galvanically connected to the interconnection between the emitter electrodes of said first and said second transistors; and
means for additively combining collector current of said fifth and said sixth transistors and applying the resultant sum current to the input terminal of said current amplifier.

9. the combination set forth in claim 1 wherein said potential follower means includes:
a fifth transistor of a second conductivity type opposite to said first conductivity type, said fifth transistor having base and emitter and collector electrodes;
means galvanically connecting the emitter electrode of said fifth transistor to the emitter electrodes of each of said third and said fourth transistors; and
means direct coupling the interconnection between the emitter electrodes of said first and said second transistors to the base electrode of said fifth transistor.

10. The combination set forth in claim 9 wherein the number N of forward-biased semiconductor junctions between the base electrodes of said third and fifth transistors is N, the number N of forward-biased semiconductor junctions between the base electrodes of said fourth and fifth transistors is N, there is no substantial dropping resistor included in said means galvanically connecting the emitter electrode of said fifth transistor to the emitter electrodes of said third and said fourth transistors; and said means direct coupling the interconnection between the emitter electrodes of said first and said second transistors to the base electrode of said fifth transistor comprises a number of forward-biased semiconductor junctions connected between said interconnection and the base electrode of said fifth transistor, whereby each of said first and said second transistors is provided with substantially equal quiescent potentials at its base and collector electrodes.

11. The combination set forth in claim 9 wherein said first and said second transistors are of super-beta type and have a concomitantly small maximum emitter-to-collector potential rating, the number of forward-biased semiconductor junctions between the base electrodes of said third and said fifth transistors is N, the number of forward-biased semiconductor junctions between the base electrodes of said fourth and fifth transistors is N, there is no substantial dropping resistor included in said means galvanically connecting the emitter electrode of said fifth transistor to the emitter electrodes of said third and said fourth transistors, and said means direct coupling the interconnection between the emitter electrodes of said first and said second transistors to the base electrode of said fifth transistor consists of a number, M, less than N, of forward-biased semiconductor junctions connected between said interconnection and the base electrode of said fifth transistor, whereby each of said first and said second transistors is provided with a quiescent base-to-collector potential substantially equal to (N-M) times the offset potential across a forward-biased semiconductor junction, N and M being so chosen that the quiescent base-to-collector potentials of said first and said second transistors are smaller than the maximum emitter-to-collector potential rating.

* * * * *